US011856687B2

United States Patent
Bulovic

(10) Patent No.: US 11,856,687 B2
(45) Date of Patent: Dec. 26, 2023

(54) POWER ELECTRONICS SYSTEM HAVING A HOUSING, A COOLING DEVICE, A POWER SEMICONDUCTOR MODULE AND A CAPACITOR DEVICE

(71) Applicant: SEMIKRON ELEKTRONIK GMBH & CO. KG, Nuremberg (DE)

(72) Inventor: Sandro Bulovic, Langenzenn (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 17/558,341

(22) Filed: Dec. 21, 2021

(65) Prior Publication Data
US 2023/0200030 A1    Jun. 22, 2023

(51) Int. Cl.
*H05K 7/20* (2006.01)
*H01L 23/495* (2006.01)

(52) U.S. Cl.
CPC ... *H05K 7/20927* (2013.01); *H01L 23/49568* (2013.01)

(58) Field of Classification Search
CPC .......... H05K 7/20297; H05K 7/20218; H05K 7/2039; H05K 7/209; H01L 23/473; H01L 23/49568; H01G 2/08; H01G 4/236
See application file for complete search history.

(56) References Cited

U.S. PATENT DOCUMENTS

| | | | |
|---|---|---|---|
| 5,420,521 A * | 5/1995 | Jones | G01R 31/2891 219/209 |
| 8,780,557 B2 | 7/2014 | Duppong et al. | |
| 9,907,215 B2 | 2/2018 | Backhaus et al. | |
| 11,259,448 B2 * | 2/2022 | Bittner | H05K 7/20927 |
| 2002/0186545 A1 | 12/2002 | Fukada et al. | |
| 2006/0119512 A1 * | 6/2006 | Yoshimatsu | H01L 25/112 342/372 |
| 2012/0008286 A1 * | 1/2012 | Suzuki | H02M 7/003 361/728 |

(Continued)

FOREIGN PATENT DOCUMENTS

| | | |
|---|---|---|
| DE | 102015113873 B3 | 7/2016 |
| EP | 3364735 A1 | 8/2018 |

OTHER PUBLICATIONS

U.S. Appl. No. 16/952,445 Office Action dated Nov. 26, 2021 8 pages.

(Continued)

*Primary Examiner* — Jayprakash N Gandhi
*Assistant Examiner* — Amir A Jalali
(74) *Attorney, Agent, or Firm* — Andrew F. Young; Nolte Lackenbach Siegel

(57) ABSTRACT

A power electronics system has a housing, a cooling device, a power semiconductor module and a capacitor device. The cooling device has a first and a second main surface. The power semiconductor module is arranged on the first main surface and is in thermally conducting contact with the cooling device and the capacitor device is arranged on the second main surface and is in thermally conducting contact with the cooling device. At least one DC connection device is connected to a DC module connection of the power semiconductor module and has a first cooling section, which is in thermally conducting contact with the cooling device.

13 Claims, 3 Drawing Sheets

(56) References Cited

U.S. PATENT DOCUMENTS

| | | | |
|---|---|---|---|
| 2012/0044646 A1* | 2/2012 | Pal | H05K 7/20909 |
| | | | 165/104.19 |
| 2013/0044434 A1* | 2/2013 | Sharaf | H05K 7/20927 |
| | | | 361/702 |
| 2013/0328185 A1 | 12/2013 | Hiramitsu et al. | |
| 2014/0133199 A1* | 5/2014 | Matsuo | H01G 17/00 |
| | | | 363/40 |
| 2014/0347820 A1* | 11/2014 | Garriga | H05K 7/2039 |
| | | | 361/717 |
| 2015/0334875 A1 | 11/2015 | Topolewski et al. | |
| 2016/0025356 A1* | 1/2016 | Obrist | F24D 3/14 |
| | | | 165/56 |
| 2016/0360643 A1* | 12/2016 | Pal | H05K 7/20154 |
| 2017/0055366 A1* | 2/2017 | Backhaus | H01L 23/467 |
| 2018/0152114 A1* | 5/2018 | Chun | H02K 11/0094 |
| 2019/0098777 A1* | 3/2019 | Nakatsu | H01L 23/3735 |
| 2019/0126773 A1* | 5/2019 | Chung | H05K 7/20254 |
| 2020/0144157 A1* | 5/2020 | Arai | H01L 24/40 |
| 2020/0279789 A1* | 9/2020 | Williams | H01L 23/3677 |
| 2020/0328027 A1 | 10/2020 | Nguyen et al. | |

OTHER PUBLICATIONS

DE 10 2019 133.952.9, German Office Action dated Nov. 5, 2020, 16 pages—English and German.
DE 10 2019 133.952.9, Response to German Office Action dated Apr. 12, 2021, 7 pages—German, 7 pages—English Translation.

* cited by examiner

POWER ELECTRONICS SYSTEM HAVING A HOUSING, A COOLING DEVICE, A POWER SEMICONDUCTOR MODULE AND A CAPACITOR DEVICE

CROSS REFERENCE TO RELATED APPLICATIONS

This application relates to, but does not claim priority from, DE 10 2019 133 952 filed Dec. 11, 2019, and published on Jun. 17, 2021, the entire contents of which are incorporated herein fully by reference.

FIGURE SELECTED FOR PUBLICATION

FIG. 2

BACKGROUND OF THE INVENTION

Field of the Invention

The invention relates to a power electronics system having a housing, a cooling device, a power semiconductor module and a capacitor device, wherein the cooling device has a first and a second main surface, wherein the power semiconductor module is arranged on the first main surface and is in thermally conducting contact with the cooling device and the capacitor device is arranged on the second main surface.

Description of the Related Art

DE 10 2015 113 873 A1 discloses as prior art a power electronics system, which is designed with a housing and a capacitor device arranged within it, wherein the housing has a cooling surface arranged inside which is designed to be cooled by means of a cooling device that is either integrated in the housing or arranged externally, and wherein the capacitor device has a capacitor with a contact device for a first and a second polarity, and a capacitor busbar. This capacitor busbar has a first flat metallic shaped body and a second flat metallic shaped body, wherein the first flat metallic shaped body is electrically conductively connected to the first contact device of the first polarity and the second flat metallic shaped body is electrically conductively connected to the second contact device of the second polarity. Furthermore, a first section of the first metallic shaped body has a first subsection, arranged parallel to and spaced apart from the cooling surface, and a second subsection, which is in thermal contact with the cooling surface, wherein both subsections are connected to each other by an intermediate section.

ASPECTS AND OBJECTS OF THE INVENTION

The object of the invention is to improve the cooling of the system and in particular of individual components.

This object is achieved according to the invention by a power electronics system having a housing, a cooling device, a power semiconductor module and a capacitor device, the cooling device having a first and a second main surface, wherein the power semiconductor module is arranged on the first main surface and is in thermally conducting contact with the cooling device and the capacitor device is arranged on the second main surface and is in thermally conducting contact with the cooling device, wherein a DC connection device, preferably all DC connection devices, is connected to a DC module connection of the power semiconductor module and has a first cooling section, which is in thermally conducting contact with the cooling device. In this case, the position of the first and second main surfaces in relation to one another is essentially arbitrary.

It can be advantageous if an AC connection device, preferably all AC connection devices, is/are connected to an AC module connection of the power semiconductor module and has a second cooling section that is in thermally conducting contact with the cooling device.

It is particularly preferred if a capacitor connection device, preferably all capacitor connection devices, of the capacitor device has a third cooling section that is in thermally conducting contact with the cooling device.

In principle, it is preferred, but not strictly necessary, if the cooling device is designed as a fluid cooling device with an inlet and an outlet device, which in one section interact with recesses of the housing, thus forming fluid connection devices there.

In particular, it can be advantageous if the cooling device 3 is formed as a multi-piece unit with the housing 2, and thus both forms separate assemblies that work together, but consist of a plurality of parts. In other words, the cooling device is not an integral part of the housing.

It can also be advantageous if the cooling device is arranged completely within the interior of the housing and is thus surrounded by the latter.

In addition, it is advantageous if the first and second main surfaces of the cooling device are arranged opposite each other or enclosing an angle, preferably a right angle, to each other.

It can be advantageous if the DC connection device comprises at least one flat DC busbar, and the length of the first cooling section is at least 30%, preferably at least 50%, of the length of the live section of the DC busbar.

In each case, it is advantageous if the respective cooling section, or the respective cooling sections, is arranged on the first or second main surface or on a secondary surface of the cooling device.

It can be advantageous if the AC connection device comprises at least one flat AC busbar, and the length of the second cooling section is at least 30%, preferably at least 50%, of the length of the live section of the AC busbar.

In principle, it is preferred if the DC connection device is connected to the capacitor connection device of the capacitor device with low inductance.

Contrary to the standard designs, it can be advantageous if the cooling device has a flow direction and in this flow direction the capacitor device is cooled before the power semiconductor module. Alternatively, it can be advantageous if the cooling device has a flow direction and in this flow direction the capacitor device is cooled simultaneously with the power semiconductor module.

In particular, it may be preferable if the cooling device has a plurality of through-flow sub-channels and in at least one of these through-flow sub-channels a controllable valve is arranged, which is designed, depending on at least one of the parameters of temperature of the power semiconductor module or temperature of the capacitor device, to regulate the flow rates through the associated through-flow sub-channel.

Of course, provided that this is not inherently or explicitly excluded, the features mentioned in the singular, in particular the power converter module, may also be present in a plurality in the system according to the invention.

It goes without saying that the various embodiments of the invention can be implemented either individually or in any combination, in order to achieve improvements. In particular, the above features and those mentioned below can be applied not only in the specified combinations, but also in other combinations or in isolation, without departing from the scope of the present invention.

Further explanations of the invention, advantageous details and features are derived from the following description of the exemplary embodiments of the invention shown schematically in FIGS. 1 and 4, or from relevant parts thereof.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
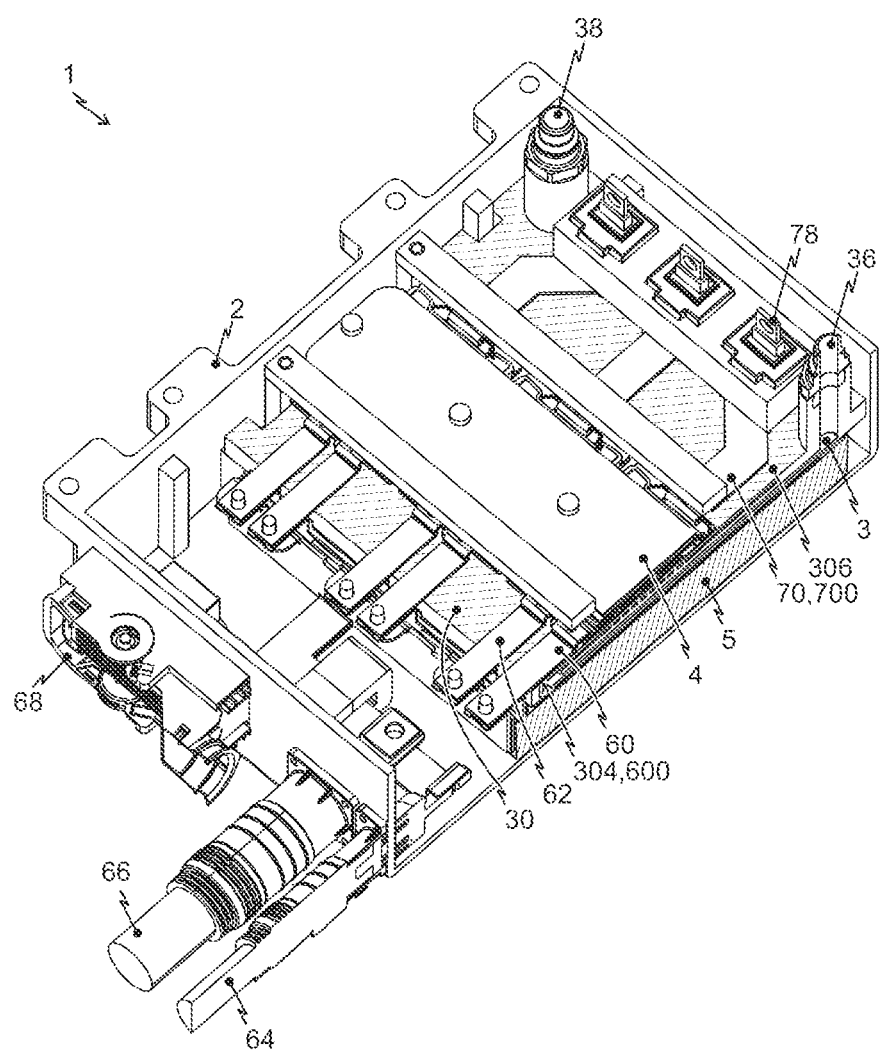
FIGS. 1 and 4 each show three-dimensional sectional views of a first power electronics system according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 4:
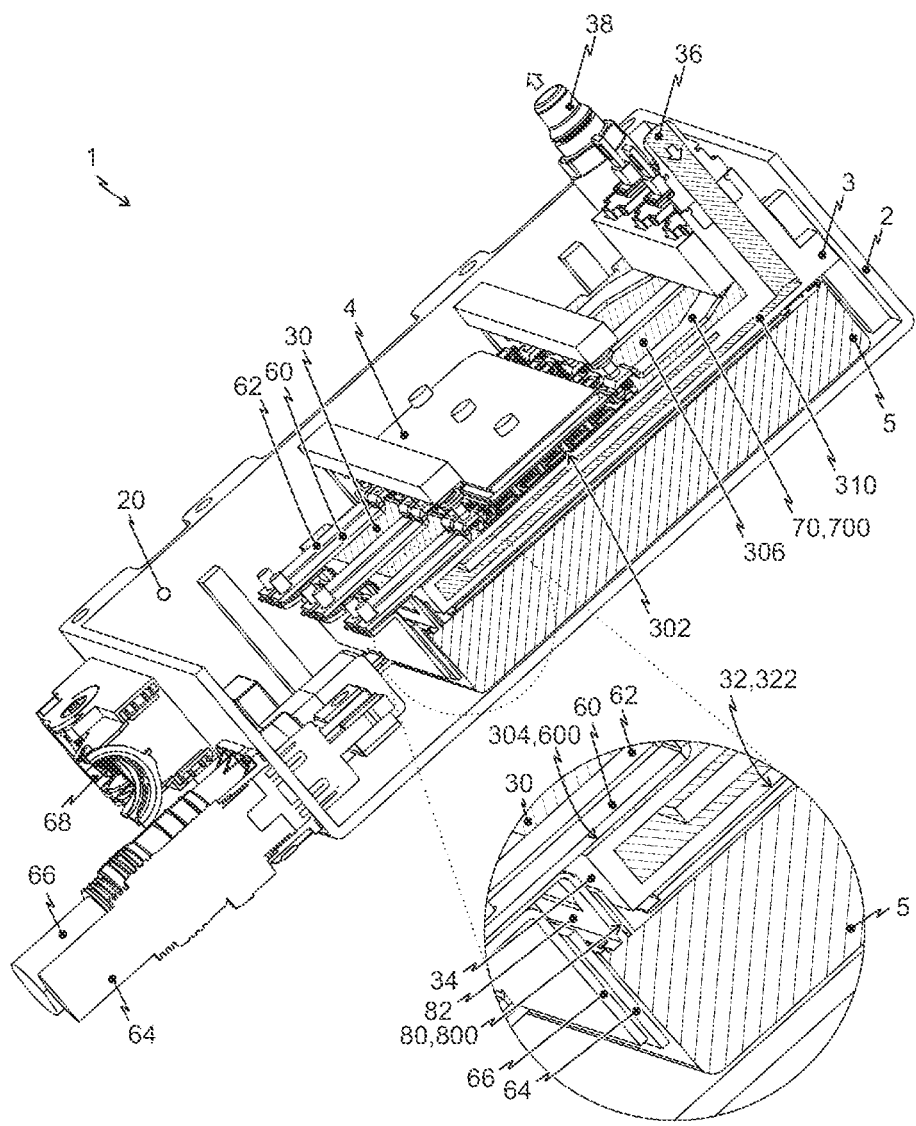

FIGS. 1 and 4 each show three-dimensional sectional views of a first power electronics system 1 according to the invention. FIG. 1 shows a housing 2 of the power electronic system, consisting of a rectangular, dish-shaped metallic shaped body with a cover element, not shown. The metallic shaped body has recesses for two DC supply connection elements 64,66 and for a control connection device 68 on a front face. Furthermore, the cover has feed-throughs for an inlet and an outlet device of a fluid cooling device and three AC output connection elements 78.

Figure 2:
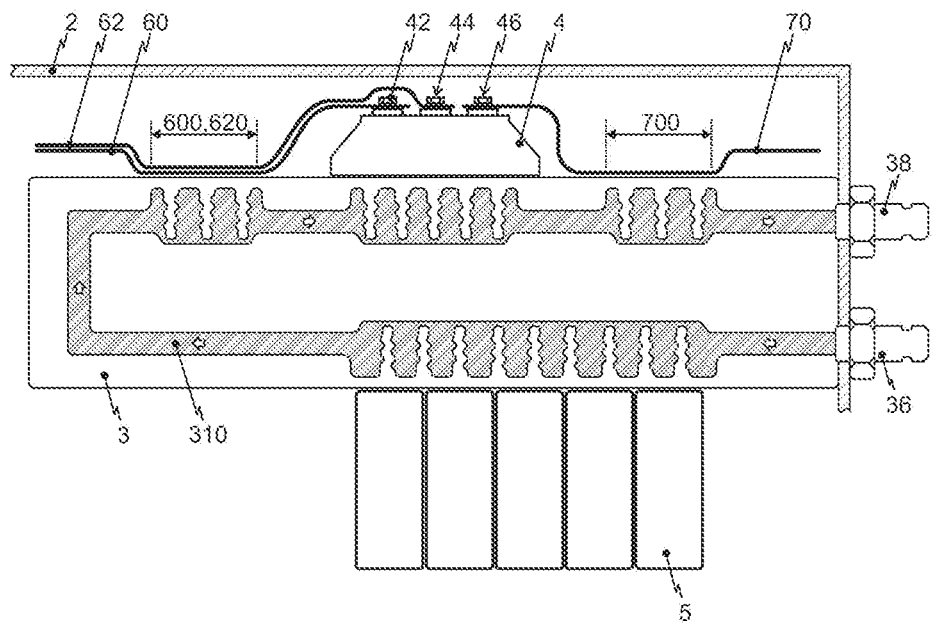
FIG. 2 shows a schematic illustration of a power electronics system according to the invention.

The cooling device 3 is formed in the shape of a plate with a first main surface opposite a second main surface 30,32 (see also FIG. 2). From the plate-shaped cooling device, the inlet device and the outlet device project vertically in the direction of the housing cover and form the fluid connection devices 36,38. The cooling device 3 itself is not part of the housing 2, but is arranged as a separate module 20 inside of the housing 2.

A power semiconductor module 4 is arranged on the first main surface 30 of the cooling device 3. This power semiconductor module 4 does not have its own housing and is arranged with its substrate directly on the first main surface 30 of the cooling device 3 and is thus thermally conductively connected thereto, more precisely to a first partial cooling surface 302 (see FIG. 3). The heat generated in the power semiconductor elements of the power semiconductor module 4 can therefore be dissipated very efficiently to the cooling device 3 and therefore to the cooling fluid.

The power semiconductor module 4 is designed as a three-phase inverter module and has three pairs of DC module connections 42,44, each consisting of a DC module connection of positive and negative polarity. It also has three AC module connections 46, which are assigned to the three output phases.

DC connection devices 60,62 are connected with the correct polarity to the respective DC module connections 42,44 (see FIG. 2), and connect the DC module connections 42,44 to assigned DC supply connection elements 64,66. All DC connection devices 60,62 each have a first cooling section 600,620, which is in thermally conductive contact with the cooling device 3, here more precisely the second partial cooling surfaces 304 thereof, arranged on the first main surface 30. For this purpose, the first cooling sections 600,620 are electrically isolated from the cooling device 3 by an insulation device, but are also arranged directly on the first main surface 30.

AC connection devices 70 are connected with the correct polarity to the respective AC module connections 46 (see FIG. 2), and connect the AC module connections to assigned AC supply connection elements 78. All AC connection devices 70 each have a second cooling section 700, which is in thermally conducting contact with the cooling device 3, here more precisely a third partial cooling surface 306 thereof (see FIG. 3) of the first main surface 30. For this purpose, the second cooling sections 700 are electrically isolated from the cooling device 3 by an insulation device, but are also arranged directly on the first main surface 30.

A capacitor device 5 is arranged on the second main surface 32, opposite the first, of the cooling device 3. This capacitor device 5 is electrically insulated, but in addition is arranged directly on a partial cooling surface 322 (see FIG. 3) of the second main surface 32 of the cooling device 3 and thus thermally conductively connected thereto.

One of the two capacitor connection devices 80,82 (see FIG. 4) of the capacitor device 5 has a third cooling section 800, which is in thermally conductive contact with a partial cooling surface of a secondary surface 34 of the cooling device 3.

The flow through the cooling device 3 here, without restriction of generality, is formed in such a way that only the section with the capacitor device 5 and thereafter the section with the power semiconductor module 4 is permeated.

FIG. 2 shows a schematic illustration of a power electronics system according to the invention. Shown here is a section of a housing 2 of the power electronics system. The housing 2 has recesses in which fluid connection devices 36,38 are arranged, which form an inlet and outlet device of the cooling device 3, which thus extend through the housing to the outside where they provide the supply and discharge of coolant.

The cooling device has a plurality of partial cooling sections 302,304,306,322 (see FIG. 3 in each case), each of which is used to cool further components that are in thermally conductive contact with these cooling surfaces and are therefore cooled by the cooling device 3. The cooling chambers 303,305,307,323 (see FIG. 3 in each case) assigned to these partial cooling sections 302,304,606,322 are passed through in series by the cooling fluid according to this embodiment, which means the cooling device 3 has a corresponding serial flow direction.

A power semiconductor module 4 is arranged on the first partial cooling surface 302 of the first main surface 30 of the cooling device 3. This power semiconductor 4 comprises two DC module connections 42,44 and an AC module connection 46.

Two DC connection devices 60,62 are shown, which are used to connect the power semiconductor module 4 to one or more DC sources, for example a capacitor device 5 or a battery. These DC connection devices 60,62 are connected to the assigned DC module connections 42,44 of the power semiconductor module 4. According to the invention, one of the two DC connection devices 60 with its first cooling section 600 is in direct thermally conducting contact with the second partial cooling surface 304 of the cooling device 3, which is formed as part of the first main surface 30. In this design, the other of the two DC connection devices 62 is located in a first cooling section 602 of the cooling device in indirect thermally conducting contact, namely via the directly connected DC connection devices 60, with the cooling device 3. Of course, the necessary electrical insulation is also provided here.

Also shown is an AC connection device 7, which is connected to the AC module connection 46 of the power semiconductor module 4 and has a second cooling section 700, which is in thermally conducting contact with the cooling device 3 and with the third partial cooling surface of the first main surface there.

On the second main surface 32 of the cooling device, the capacitor device 5 is arranged and is in thermally conducting contact with the cooling device 3, more precisely its partial cooling surface. In this case, the first and second main surfaces 30,32 of the cooling device 3 are parallel to each other and opposite each other on the cooling device.

The cooling device 3 here has a through-flow channel 310 with a serial flow direction, wherein the components capacitor device 5, DC connection device 60, power semiconductor module 4 and AC connection device 70 are cooled in this sequence.

Figure 3:
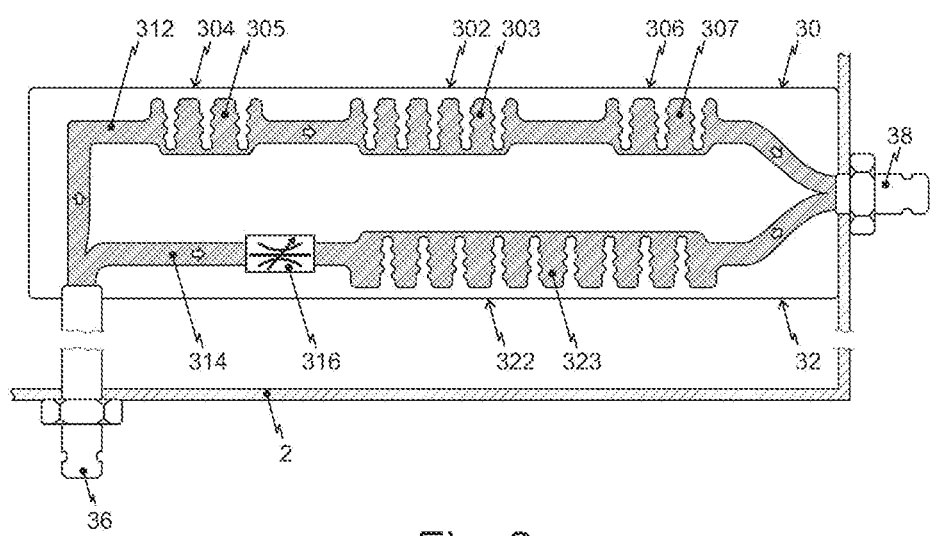
FIG. 3 shows a simplified schematic illustration of a further power electronics system according to the invention.

FIG. 3 shows a simplified schematic illustration of a further power electronics system according to the invention. In this case, the components mentioned in relation to FIG. 2 are arranged on the same partial cooling surfaces, as mentioned there.

The cooling device 3 according to this design differs from that according to FIG. 2 basically only in that the cooling device 3 has a parallel flow direction in which the capacitor device 5 is cooled simultaneously, i.e., not serially, with the power semiconductor module 4. For this purpose, the through-flow channel has a separation point and a merging point, at which the fluid flow is divided into two through-flow sub-channels 312,314 or recombined respectively.

In one of these through-flow sub-channels 314 a controllable valve 316 is arranged, which is designed to regulate the flow rates through the associated through-flow sub-channel 314 depending on at least one of the parameters of temperature of the power semiconductor module 4 or temperature of the capacitor device 5.

FIG. 4 shows another view of a first power electronics system 1 according to the invention. This illustration shows that each DC connection device 60 comprises a flat DC busbar comprising the first cooling section 600, and wherein the length of this first cooling section 600 is approximately 60% of the length of the live section of the DC busbar.

The respective AC connection device 7 comprises a flat AC busbar comprising the second cooling section 700, wherein the length of the second cooling section 700 is also approximately 60% of the length of the live part of the AC busbar.

One of the two capacitor connection devices 8 of the capacitor device 5 has a third cooling section 800, which is in thermally conducting contact with a partial cooling surface of a secondary surface 34 of the cooling device 3.

The respective DC connection device 60,62 is connected to the respectively assigned capacitor connection device 80,82 of the capacitor device 5 with low inductance.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronics system comprising:
a housing, a cooling device, a power semiconductor module and a capacitor device;
wherein the cooling device has a first main surface and a second main surface;
wherein the power semiconductor module is on the first main surface and is in thermally conducting contact with a first cooling partial surface of the first main surface of the cooling device;
wherein the capacitor device is arranged on the second main surface and is in thermally conducting contact with the cooling device;
wherein a DC connection device is connected to a DC module connection of the power semiconductor module and further comprises at least a first cooling section, in a thermally conducting contact with a second cooling partial surface as part of the first main surface of the cooling device;
wherein the cooling device has at least a first and a second cooling chamber that are each respective liquid cooling chambers for being traversed by a cooling liquid and are each associated with respectively the first and the second cooling partial surfaces;
an AC connection device is connected to an AC module connection of the power semiconductor module and has a second cooling section, which is in thermally conducting contact with the cooling device;
a capacitor connection device of the capacitor device has a third cooling section; and
the third cooling section is in thermally conducting contact with the cooling device.

2. The power electronics system according to claim 1; wherein:
the cooling device is a fluid cooling device with an inlet device and an outlet device; and the fluid cooling device, in one section, interacts with a plurality of recesses of the housing, forming respective fluid connection devices.

3. The power electronics system according to claim 2; wherein:
wherein the cooling device is formed as a multi-piece unit with the housing.

4. The power electronics system according to claim 3, wherein: the cooling device (3) is arranged completely within interior (20) of the housing (2) and is surrounded by the housing (2).

5. The power electronics system according to claim 4, wherein:
the first main surface and the second main surface of the cooling device are arranged at least one of (i) opposite each other, (ii) enclosing an acute angle with each other, and (iii) at a right angle to each other.

6. The power electronics system according to claim 4, wherein:
the DC connection device comprises at least one flat DC busbar; and
wherein the length of the first cooling section is at least 30% of the length of a live section of the DC busbar.

7. The power electronics system according to claim 6, wherein:
respective at least first cooling section is arranged on one of the first or the second main surface or on a secondary surface of the cooling device.

8. The power electronics system according to claim 7, wherein:
the AC connection device further comprises:
at least one flat AC busbar;
wherein the length of the second cooling section is at least 30% of the length of a live section of the AC busbar.

9. The power electronics system according to claim 8, wherein:
the respective DC connection devices are connected to the respective capacitor connection devices of the capacitor device with a low inductance.

10. The power electronics system according to claim 9, wherein:
the cooling device has a flow direction and in the flow direction the capacitor device is cooled before the power semiconductor module.

11. The power electronics system according to claim 9, wherein:
the cooling device has a flow direction and in the flow direction the capacitor device is cooled simultaneously with the power semiconductor module.

12. The power electronics system according to claim 4, wherein:
the cooling device has a plurality of through-flow sub-channels and in at least one of the through-flow sub-channels a controllable valve is arranged; and
the controllable valve regulates the flow rates through the associated through-flow sub-channel depending on at least one parameter of the group of parameters consisting of a temperature of the power semiconductor module and a temperature of the capacitor device.

13. A power electronics system, comprising:
a housing, a cooling device, a power semiconductor module and a capacitor device;
wherein the cooling device has a first main surface and a second main surface;
wherein the power semiconductor module is on the first main surface and is in thermally conducting contact with a first cooling partial surface of the first main surface of the cooling device;
wherein the capacitor device is arranged on the second main surface and is in thermally conducting contact with the cooling device;
wherein a DC connection device is connected to a DC module connection of the power semiconductor module and further comprises at least a first cooling section in a thermally conducting contact with a second cooling partial surface as part of the first main surface of the cooling device;
wherein the cooling device has at least a first and a second cooling chamber that are each respective liquid cooling chambers for being traversed by a cooling liquid and are each associated with respectively the first and the second cooling partial surfaces;
an AC connection device is connected to an AC module connection of the power semiconductor module and has a second cooling section, which is in thermally conducting contact with the cooling device;
a capacitor connection device of the capacitor device has a third cooling section;
the third cooling section is in thermally conducting contact with the cooling device.
the cooling device is arranged completely within interior of housing and is surrounded by the housing; and
the first main surface and the second main surface of the cooling device are arranged at least one of (i) opposite each other, (ii) enclosing an acute angle with each other, and (iii) at a right angle to each other.

* * * * *